(12) United States Patent
Michal (10) Patent No.: US 9,709,608 B2
(45) Date of Patent: Jul. 18, 2017

(54) ABSOLUTE VALUE CURRENT-SENSING CIRCUIT FOR STEP-DOWN DC-TO-DC CONVERTERS WITH INTEGRATED POWER STAGE

(71) Applicant: Optis Circuit Technology, LLC, Plano, TX (US)

(72) Inventor: Vratislav Michal, Grenoble (FR)

(73) Assignee: OPTIS CIRCUIT TECHNOLOGY, LLC, Plano, TX (US)

( * ) Notice: Subject to any disclaimer, the term of this patent is extended or adjusted under 35 U.S.C. 154(b) by 140 days.

(21) Appl. No.: 14/707,528

(22) Filed: May 8, 2015

(65) Prior Publication Data

US 2015/0285843 A1    Oct. 8, 2015

Related U.S. Application Data

(63) Continuation of application No. PCT/EP2013/073233, filed on Nov. 7, 2013.

(60) Provisional application No. 61/734,085, filed on Dec. 6, 2012.

(51) Int. Cl.

| | |
|---|---|
| G01R 19/165 | (2006.01) |
| G01R 19/00 | (2006.01) |
| H02M 3/156 | (2006.01) |
| H02M 3/158 | (2006.01) |
| H02M 1/00 | (2006.01) |
| H02S 50/10 | (2014.01) |

(52) U.S. Cl.
CPC ... *G01R 19/16552* (2013.01); *G01R 19/0084* (2013.01); *G01R 19/0092* (2013.01); *H02M 3/156* (2013.01); *H02M 3/1588* (2013.01); *H02M 2001/0009* (2013.01); *H02S 50/10* (2014.12); *Y02B 70/1466* (2013.01)

(58) Field of Classification Search
CPC .................................................. H02M 1/0009
See application file for complete search history.

(56) References Cited

U.S. PATENT DOCUMENTS

| | | | |
|---|---|---|---|
| 5,018,041 A | * | 5/1991 | Szepesi ............. H03K 17/0822 361/18 |
| 5,847,554 A | | 12/1998 | Wilcox et al. |
| 5,959,464 A | | 9/1999 | Qualich |
| | | | (Continued) |

OTHER PUBLICATIONS

International Search Report issued in corresponding International application No. PCT/EP2013/073233, date of mailing of search report Dec. 13, 2013.

(Continued)

*Primary Examiner* — Clayton E Laballe
*Assistant Examiner* — Noam Reisner
(74) *Attorney, Agent, or Firm* — The Danamraj Law Group, P.C.; Thomas L. Crisman; Kenneth A. McClure (57) ABSTRACT

A system for measuring an output current of a DC-to-DC converter with a transistor power stage includes a voltage measuring circuit and an impedance. The voltage measuring circuit, which is connected to the output of the power stage of the DC-to-DC converter, measures an average voltage drop on impedances of the transistors of the power stage. The impedance, which is connected to an output of the voltage measuring circuit, reproduces the impedances of the transistors of the power stage and is traversed by a scaled version of the current output of the voltage measuring circuit.

14 Claims, 7 Drawing Sheets

(56) References Cited

U.S. PATENT DOCUMENTS

| | | | |
|---|---|---|---|
| 8,692,534 B2* | 4/2014 | Trochut | H02M 3/1588 323/271 |
| 2002/0158615 A1 | 10/2002 | Goodfellow et al. | |
| 2006/0261860 A1* | 11/2006 | Yamada | H02M 3/156 327/77 |

OTHER PUBLICATIONS

Written Opinion of the International Searching Authority issued in corresponding International application No. PCT/EP2013/073233, date of mailing of the opinion Dec. 13, 2013.

Extended European Search Report issued in corresponding European application No. EP 12 30 6397, date of completion of the search Apr. 17, 2013.

Forghani-Zadeh, Hassan Pooya, et al., "Current-Sensing Techniques for DC-DC Converters," The 2002 45th Midwest Symposium on Circuits and Systems, MWSCAS-2002, Aug. 4-7, 2002, pp. II-577-II-580 (vol. 2), Print ISBN: 0-7803-7523-8, DOI: 10.1109/MWSCAS.2002.1186927, IEEE.

* cited by examiner

FIG. 13

ABSOLUTE VALUE CURRENT-SENSING CIRCUIT FOR STEP-DOWN DC-TO-DC CONVERTERS WITH INTEGRATED POWER STAGE

CROSS-REFERENCE TO RELATED APPLICATIONS

This application is Continuation Application of International Application No. PCT/EP2013/073233, filed on Nov. 7, 2013, which claims priority and benefit from EP Patent Application No. 12306397.6, filed Nov. 12, 2012 and U.S. Provisional Application 61/734,085, filed Dec. 6, 2012, the entire contents of which are incorporated herein by reference.

FIELD OF THE INVENTION

The invention relates to a system and a method for measuring an output current of a step-down DC-to-DC converter.

BACKGROUND OF THE INVENTION

The sensing of the output current presents nowadays a highly required feature in the DC-to-DC converters design, encountered across all SMPS (switched-mode power supply) device manufacturers. Indeed, the knowledge of the DC-to-DC converter output current is required for the platform development (e.g. optimisation of the software allowing the power consumption reduction in e.g. mobile phone platform). Moreover, information about the output current can also be used to drive the internal functions of the DC-to-DC converter.

In the integrated power supply, we encounter basically two solutions of current sensing. The first relies on external resistance current sensing: the voltage drop on a known resistance (e.g. discrete resistance, parasitic resistance of inductance . . . ) is measured, and the current can be obtained by using ohms law. However, this technique suffers from several drawbacks. Firstly, the extra resistance introduced in the power path considerably decreases the power efficiency of the DC-to-DC converter. Secondly, when a parasitic resistance is used for the current sensing, a complicated calibration mechanism is to be implemented, notably for compensating the variation of the resistance, due to the temperature variation. In practice, it is complicated (say impossible) to compensate perfectly. If the calibration system is not implemented, a circuit using parasitic resistance sensing provides only relative information about output current.

The second technique is based on the N or P-MOS drain-to-source voltage sensing and its recopy onto known MOS resistance (copy-MOS transistor). This technique is useful for obtaining an absolute value of output current at a given time, but it does not allow obtaining the average value of the output current in a simple manner, which is generally required. Furthermore, this technique suffers from low accuracy, namely at the high switching frequency of the DC/DC converter. This is due to the limitation of high-speed operation amplifier inside the current-replica circuit.

Thus, the above mentioned techniques suffer generally from one of the following drawbacks: lack of the absolute value information, high complexity of the circuit for measuring the current, low accuracy or decrease of the power efficiency of the DC-to-DC converter.

SUMMARY OF THE INVENTION

The object of the present invention is to alleviate at least partly the above mentioned drawbacks. More particularly, embodiments of the invention aim to provide an accurate measurement of the output current of the DC-to-DC converter, with a very simple circuit implementation, without affecting the efficiency of the DC-to-DC converter.

This is achieved with a system for measuring an output current $\hat{I}_{OUT}$ of a DC-to-DC converter with a transistor power stage. The system comprises a voltage measuring circuit, connected to the output of the power stage of the DC-to-DC converter, for measuring an average voltage drop $V'_{AVG}$ on impedances $R_{DS(P,N)}$ of the transistors of the power stage. The system also comprises an impedance $R_{Composite}$, connected to an output of the voltage measuring circuit providing a current $I'_{OUT}$, the impedance $R_{Composite}$ reproducing the impedances $R_{DS(P,N)}$ of the transistors of the power stage and being traversed by the current $I'_{OUT}$ such that $\hat{I}_{OUT} = V_{AVG}/(G \cdot k \cdot R_{Composite}) = I_{OUT}'/(G \cdot k)$, wherein k is a scaling ratio and G is a voltage gain that amplifies the voltage $V'_{AVG}$ to $V_{AVG}$.

Because the measured voltage drop on the DC/DC converter power stage is applied on the impedance $R_{Composite}$ (being the scaled copy of the composite resistance of the power stage), it is possible to obtain an absolute value scaled replica of the output current of the DC-to-DC converter. This allows to measure the output current $\hat{I}_{OUT}$ of the DC-to-DC converter without introducing an external resistance in the output of the DC-to-DC converter, thus avoiding any decrease of the power efficiency of the DC-to-DC converter. No extra passive element in the power path is therefore required.

This is also achieved with a process for measuring an output current $I'_{OUT}$ of a DC-to-DC converter, the DC-to-DC converter comprising a transistor power stage. The process of measurements comprises obtaining an amplified average voltage drop $V'_{AVG}$ on impedances $R_{DS(P,N)}$ of the transistors of the power stage. The process further comprises applying the amplified average voltage drop $V_{AVG} = G \cdot V'_{AVG}$ on an impedance $R_{Composite}$ that reproduces the impedances $R_{DS(P,N)}$ of the transistors of the power stage (G stands for an arbitrary gain). The process also comprises measuring a current $I'_{OUT}$ that traverses the impedance $R_{Composite}$. The process further comprises obtaining the output current $\hat{I}_{OUT}$ from the measured current $I'_{OUT}$ by the relation $\hat{I}_{OUT} = V_{AVG}/(G \cdot k \cdot R_{Composite}) = I'_{OUT}/(G \cdot k)$ wherein k is a scaling ratio and G is the voltage gain that amplifies the voltage $V'_{AVG}$ to $V_{AVG}$.

This is likewise achieved with a DC-to-DC converter with a transistor power stage. The DC-to-DC converter comprises a system for measuring an output current $\hat{I}_{OUT}$ of a DC-to-DC converter according to the invention.

Preferred embodiments comprise one or more of the following features:

the impedance $R_{Composite}$ comprises at least one N-MOS transistor and at least one P-MOS transistor that are connected in parallel, the N-MOS and P-MOS transistors operating in ohmic area, being simultaneously switched with the transistors of the power stage and driven by control signals of the transistors of the power stage;

the impedance $R_{Composite}$ comprises at least two N-MOS transistors connected in series, two successive N-MOS transistors sharing a drain and a source, at least two P-MOS transistors connected in series, two successive P-MOS transistors sharing a drain and a source;

the system further comprises a voltage inverter providing, to the gate of the least one P-MOS transistor of the impedance $R_{Composite}$, a negative voltage of control signal (CMD_P) driven P-MOS transistor of the power stage of the DC-to-DC converter; or for the case when sense-resistance is referred to GND, a voltage doubler, ensuring the NMOS transistor in composite load to be in ohmic area.

For the PMOS transistor case, the voltage inverter comprises a first P-MOS transistor ($Q_4$) with its source connected to a positive supply voltage $V_{DD}$ and its drain connected to the drain of a first N-MOS transistor ($Q_5$), the first N-MOS transistor ($Q_5$) having its source connected to a ground, a second P-MOS transistor ($Q_6$) with its source connected to the positive supply voltage $V_{DD}$ and its drain connected to the drain of a second N-MOS transistor ($Q_7$) and to the gate of a third N-MOS transistor ($Q_8$), the gate of the second N-MOS transistor ($Q_7$) and the source of the third N-MOS transistor ($Q_8$) being connected to the ground, a capacitor (C) connected, on a first end that is the output of the voltage inverter, to the drain of the third N-MOS transistor ($Q_8$) and to the source of second N-MOS transistor ($Q_7$), and connected, on a second end, to the drain of the first P-MOS transistor ($Q_4$) and to the source of the first N-MOS transistor ($Q_5$), an inverter connected, on the input, to the line providing the control signal (CMD_P), and connected, on the output, to the gates of the first and second P-MOS transistors ($Q_4$, $Q_6$) and the gate of the first N-MOS transistor ($Q_5$);

the voltage measuring circuit comprises an auxiliary power stage that is identical to the power stage of the DC-to-DC converter, similarly powered and driven, the auxiliary power stage being not traversed by the output current of the DC-to-DC converter, a differential amplifier having an output voltage $V_{AUX}$ as $V_+$ input provided by the auxiliary power stage and having an output voltage $V_{LX}$ as $V_-$ input provided by the power stage, the differential amplifier producing an output voltage that is the average voltage drop;

the voltage measuring circuit further comprises a first low-pass filter providing to the $V_+$ input of the differential amplifier an average value of the output voltage $V_{AUX}$, a second low-pass filter providing to the $V_-$ input of the differential amplifier an average value of the output voltage $V_{LX}$.

the first and second low-pass filters are at least one among the following: an RC filter of the first order, an RC filter of the second order;

the voltage measuring circuit further comprises at least one resistor between the input $V_+$ of the differential amplifier and the first low-pass filter, at least one resistor between the input $V_-$ of the differential amplifier and the second low-pass filter;

the voltage measuring circuit further comprises an RC filter connected to the input $V_+$ of the differential amplifier and the output of the differential amplifier, an RC filter connected to the input $V_-$ of the differential amplifier and the ground, a capacitor ($C_3$) connected to the output of the differential amplifier and the ground;

the voltage measuring circuit further comprises a first disconnection circuit for disconnecting the $V_+$ input from the auxiliary power stage and a second disconnection circuit for disconnecting the $V_-$ input from power stage during body-diode conduction intervals of the transistors of the power stage and of transistors of the auxiliary power stage;

the differential amplifier comprises a current sensor for sensing the output current I'$_{OUT}$ at the positive supply rail of the differential amplifier, the current sensor comprising an impedance $R_{sense}$ traversed by the output current I'$_{OUT}$ of the DC-to-DC converter such that an output voltage $V_{OUT}$ is proportional to the output current I'$_{OUT}$;

the DC-to-DC converter is integrated on a single integrated component.

Further features and advantages of the invention will appear from the following description of embodiments of the invention, given as non-limiting examples, with reference to the accompanying drawings listed hereunder.

DETAILED DESCRIPTION OF THE INVENTION

Figure 1:
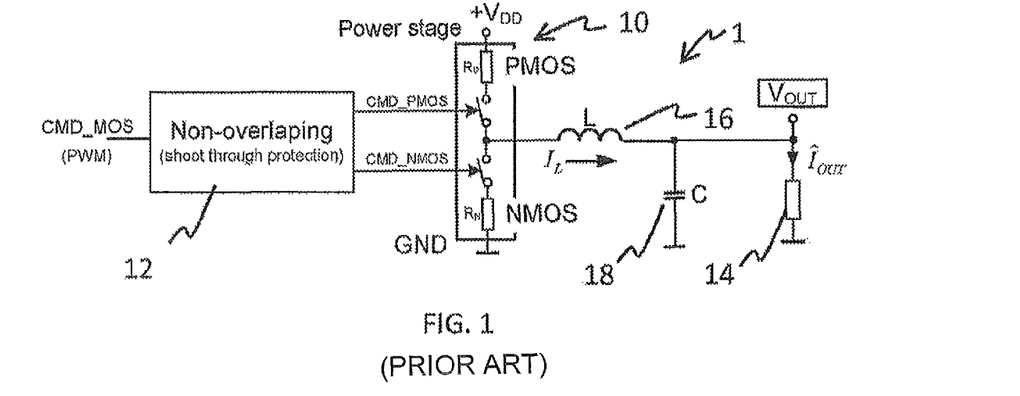
FIG. 1 shows a simplified schematic example of the step-down power stage with integrated power switches.

FIG. 1 shows a simplified schematic of an example of a conventional step-down DC-to-DC converter power stage 1. The power stage 1 represented in FIG. 1 is a step-down or Buck type. It comprises power switches 10 that use two switches. The switches are here a P-MOS and an N-MOS, also referred to as power transistors. The power stage is in this case a transistor power stage. The power transistors may be P and N channel Metal-Oxide-Silicon transistors. The power stage supplies energy to an inductor 16 and a capacitor 18. To this aim, power stage is powered by power rails supplying a positive supply voltage $V_{DD}$ and a ground GND (or negative supply voltage $V_{SS}$). The inductor current is thus controlled by the switches of the power stage 10. The DC-to-DC converter 1 further comprises a PWM (pulse-duration modulation) generator that generates driving commands CMD_MOS of the switches, that is opening or closing the switches. The DC-to-DC power stage further comprises a non-overlapping circuit 12 that creates driving commands with death time. This circuit 12, also referred to as "shoot through protection", avoids short-circuit conditions occurring when both the switches are ON at the same time.

Figure 2:
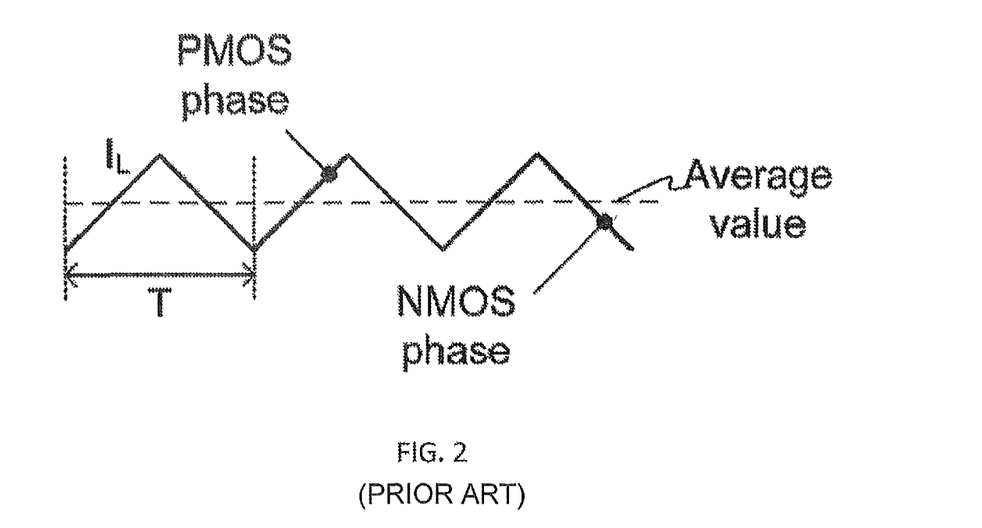
FIG. 2 shows an example of the inductor sawtooth current $I_L$, and the average output current $\hat{I}_{OUT}$ of the DC-to-DC converter depicted on FIG. 1.

Referring now to FIG. 2, the average value of the output current $\hat{I}_{OUT}$ of the DC-to-DC converter of FIG. 1 is represented, together with the power stage output current $I_L$. The current $I_L$ is the current that passes through the inductor 16 of FIG. 1. $\hat{I}_{OUT}$ is considered to have a stable (constant) value during one clock period T, while the power stage output current $I_L$ is not constant. The period T is the time during which both the N-MOS and the P-MOS of the power stage have been ON one time. The power stage output current contains triangular (sawtooth) components, related to the N-MOS and P-MOS transistor switching phases, and current integration property of an inductor. When the P-MOS is ON (conductive) and the N-MOS is OFF (non-conductive), this is defined as the P-MOS phase, the current $I_L$ through the inductor 16 increases; on the contrary, during the N-MOS phase (P-MOS is OFF and the N-MOS is ON), $I_L$ decreases.

The average output current $\hat{I}_{OUT}$ can be obtained as time integral of the triangular current $I_L$:

$$\hat{I}_{OUT} = \frac{1}{T}\int_T I_L dt \qquad (1.2)$$

A circuit performing time averaging can thus be used in order to obtain information about the average output current $\hat{I}_{OUT}$ of the DC-to-DC converter from the triangular power stage output current $I_L$.

The system for measuring the output current $\hat{I}_{OUT}$ of a DC-to-DC converter, wherein $\hat{I}_{OUT}$ is an average output current delivered by the DC-to-DC converter during one switching period T to a load 14 connected to the output of the DC-to-DC converter, is intended to provide a replica current $I'_{OUT}$ of the DC-to-DC power stage average output current. This replica current can be represented by the following equation:

$$I'_{OUT} = K \cdot \hat{I}_{OUT} \qquad (1.1)$$

wherein K is scaling constant<<1. In a case that the value of K is guaranteed, absolute value current sensing is provided. On the contrary, where the value of K is not known but is constant, a relative value current sensing is provided.

In the power stage of the DC-to-DC converter, an average voltage drop $V'_{AVG}$ can be provided by the impedances (also referred to as resistance) $R_{DS(P,N)}$ of the transistors of the power stage. Said otherwise, a voltage drop due to the output current $\hat{I}_{OUT}$ is the voltage drop on the power stage composite resistances; the current $\hat{I}_{OUT}$ being the averaged output current $I_L$ of the power stage. The voltage drop $V'_{AVG}$ can also be referred to as composite voltage drop, in reference to the composite resistances of the power stage.

The resistance $R_{DS(P)}$ of P-MOS and the resistances $R_{DS(N)}$ of the N-MOS transistor of the power stage can be obtained from the sheet resistances $R_{DS\square}$ such that $$R_{DS(P,N)} = R_{DS\square(P,N)} \frac{L}{W_{(P,N)}} \qquad (1.3)$$

where L is the P-MOS or N-MOS transistor channel length and W is the channel width. In fact, during the P-MOS or N-MOS conducting phases, the respective average $\hat{V}_{DS(P)}$ and $\hat{V}_{DS(N)}$ voltage drops can be obtained by ohms law:

$$\hat{V}_{DS(P)} = R_{DS(P)} \cdot \hat{I}_{OUT} \qquad (1.4a)$$

$$\hat{V}_{DS(N)} = R_{DS(N)} \cdot \hat{I}_{OUT} \qquad (1.4b)$$

It is to be noted that the impedance $R_{DS(P,N)}$ depends strongly on the positive supply voltage $V_{DD}$ provided by the power rail, at the temperature T, and process variations.

Figure 3:
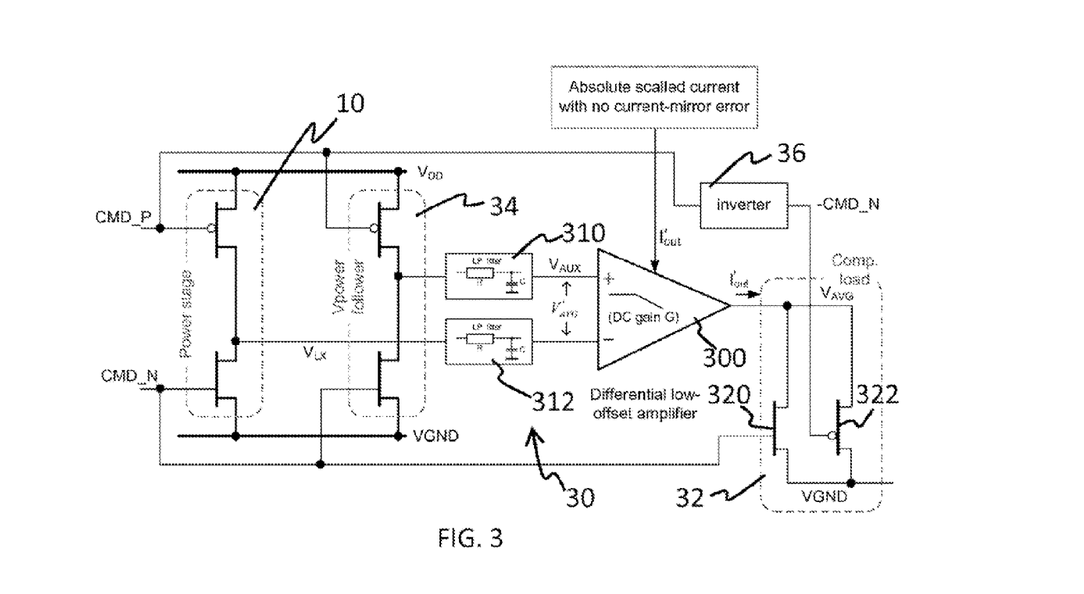
FIG. 3 shows an example of a system for measuring an output current $\hat{I}_{OUT}$ of a DC-to-DC converter.

In reference to FIG. 3, an auxiliary power stage 34 is shown (also referred to as a Vpower follower in FIG. 3), with identical power-supply rails and identical driving signals as the power stage 10. Preferably, the auxiliary stage 34 is not driving any current and therefore provides an output voltage that is not affected by the impedances $R_{DS(P,N)}$ of its transistors. The auxiliary power stage 34 is identical to the power stage of the DC-to-DC converter; in practice, this means that the auxiliary power stage similar but much smaller than the power stage of the DC-to-DC converter.

The main purpose of the auxiliary power stage 34 is to provide information about the power supply rails $V_{DD}$ and GND during the P-MOS or N-MOS conduction phases. With this auxiliary power stage, an exact voltage drop across the P-MOS and N-MOS transistor of the power stage can be obtained.

Still in reference to FIG. 3, the output of the power stage 10 and the auxiliary power stage 34 leads to the RC filters 312 and 310, respectively. These RC filters provide an average value of the $V_{LX}$ output voltage of the power stage 10, and an average voltage of the $V_{AUX}$ output voltage of the auxiliary power stage. The difference between these averaged voltages $V_{LX}$ and $V_{AUX}$ is referred to as $V'_{AVG}$. This voltage $V'_{AVG}$ is referred to as average composite voltage drop. The RC low-pass filters provide the time integral represented by the equation (1.2).

Again, in reference to FIG. 3, the outputs of the RC filters lead to a differential amplifier 300 with a differential gain G. The differential amplifier has the inputs connected to the outputs of RC filters 310 and 312, and has a voltage output labeled $V_{AVG}$.

While the average voltage drop between the power stage and the auxiliary power stage output voltages is described by equations (1.4a) and (1.4b), the voltage $V_{AVG}$ at the output of the differential amplifier 300 can be described by the following equation.

$$V_{AVG} = G\{D \cdot R_{DS(P)} \cdot \hat{I}_{OUT} + (1-D)R_{DS(N)} \cdot \hat{I}_{OUT}\} \qquad (1.5)$$
$$= G \cdot \hat{I}_{OUT}\{D \cdot R_{DS(P)} + (1-D)R_{DS(N)}\}$$

This equation (1.5) shows the dependency of the differential amplifier output voltage $V_{AVG}$ on duty-cycle D, and the P-MOS's and N-MOS's impedances $R_{DS(P,N)}$. The impedances $R_{DS(P,N)}$ of the transistors of the power stage depend on compounds such as the channel width W, the channel length L, the positive supply voltage $V_{DD}$ and the temperature of the system.

In order to eliminate these compounds and to eliminate the dependency on duty-cycle, the circuit from FIG. 3 contains a composite load element 32 comprising a sense N-MOS transistor 320 and a sense P-MOS transistor 322. These transistors 320 and 322 have a constant ration of W compared to their power-stage counterparts. The channel width $W_{(N,P)}$ of sense N-MOS 320 and sense P-MOS 322 is $k \cdot W_{power(N,P)}$, where $W_{power(N,P)}$ stands for the channel width of the power stage N-MOS and P-MOS.

Still referring to FIG. 3, the transistors 320, 322 in the composite load 32 are switched simultaneously with power stage transistors. Because the composite load reproduces the impedances $R_{DS(P,N)}$, this allows to realize a duty-cycle dependent resistance matched to the power stage resistance $R_{DS(P,N)}$. Thus, averaged in one conduction cycle T, the composite load 32 exhibits an equivalent resistance $R_{Composite} = \{D \cdot k R_{DS(P)} + (1-D) k R_{DS(N)}\}$ which advantageously allows eliminating all parasitic components from the voltage drop $V_{AVG}$. The ratio $V_{AVG}/R_{Composite}$ is therefore represented by the relation:

$$V_{AVG} / R_{Composite} = I'_{OUT} \quad (1.6)$$
$$= \frac{G \cdot \hat{I}_{OUT} \{D \cdot R_{DS(P)} + (1-D) R_{DS(N)}\}}{\{D \cdot k R_{DS(P)} + (1-D) k R_{DS(N)}\}}$$
$$= G \cdot k \cdot \hat{I}_{OUT}$$

and corresponds therefore to the exact scaled replica of the averaged output current $\hat{I}_{OUT}$. k stands for the scaling ratio between the transistors of the impedance $R_{Composite}$ and the power-stage transistors. In practice, k is such that $k \ll 1$, e.g. $10^{-4}$.

In reference to FIG. 3, the voltage drop $V'_{AVG}$ provided by the impedances $R_{DS(P,N)}$ of the transistors of the power stage can be measured by a current sensing circuit 30. This circuit 30 is also referred to as voltage measurer. In this system, the voltage drop is measured at the output of the low-pass RC filters 310 and 312 connected to the power stage of the DC-to-DC converter and the auxiliary power stage 34. A differential amplifier 300 can provide a voltage gain G which amplifies the voltage $V'_{AVG}$ to $V_{AVG}$.

In order to obtain an absolute value of the scaled replica $I'_{OUT}$, the current $I'_{OUT}$ passes through the impedance $R_{Composite}$ that is connected to the output of the differential amplifier. The voltage $V_{AVG}$ passing through the impedance $R_{Composite}$ provides the current $I'_{OUT}$, related by ohms law $V_{AVG} = R_{Composite} \cdot I'_{OUT}$. The impedance $R_{Composite}$ reproduces the impedances $R_{DS(P,N)}$ of the transistors of the power stage. It results in that $\hat{I}_{OUT} = V_{AVG}/(G \cdot k \cdot R_{Composite}) = I'_{OUT}/(G \cdot k)$ wherein k is a scaling ratio between the impedance of $R_{Composite}$ and the impedances of the power stage P-MOS and N-MOS transistor resistances $R_{DS(P,N)}$, and G is an arbitrarily gain of the voltage amplifier.

The measure of the output current $\hat{I}_{OUT}$ of a DC-to-DC converter is thus the result of a process wherein, at the output of the power stage of the DC-to-DC converter, a voltage drop is measured, the measurement being performed on impedances $R_{DS(P,N)}$ of the transistors of the power stage, and then this voltage is averaged by RC-filter 310 and 312. The $V'_{AVG}$ is obtained as the difference between the output of the RC filter 310 and 312 (thus the differential amplifier 300 is used), and then, the averaged output current $I'_{OUT}$ is obtained as the scaled replica of $\hat{I}_{OUT}$ by applying the $V_{AVG}$ on the impedance $R_{Composite}$. The impedance $R_{Composite}$ is connected to the output of the differential amplifier 300 that amplifies the average voltage drop $V'_{AVG}$. The impedance $R_{Composite}$ reproduces the impedances $R_{DS(P,N)}$ of the transistors of the power stage, and the averaged output current $\hat{I}_{OUT}$ is defined by ratio $\hat{I}_{OUT} = V_{AVG}/(G \cdot k \cdot R_{Composite}) = I'_{OUT}/(G \cdot k)$ wherein k is the scaling ratio.

Back to FIG. 3, an example of impedance $R_{Composite}$ 32 reproducing the impedances $R_{DS(P,N)}$ of the transistors of the power stage is presented. It may comprise one N-MOS transistor 320 and one P-MOS transistor 322 that are connected in parallel: the sources of N-MOS and drain of P-MOS are connected to $V_{GND}$, and the drain terminals of N-MOS connected with the source of P-MOS represents the input terminal which presents an input impedance $R_{Composite}$. Thus, by applying the voltage $V_{AVG}$, the scaled replica $I'_{OUT}$ of the output current is obtained. More particularly, the source of the N-MOS and the drain of the P-MOS are connected to the positive supply voltage $V_{DD}$. The N-MOS and P-MOS transistors 320 and 322, operating in ohmic area, are simultaneously switched with the transistors of the power stage: they are driven by control signals of the transistors of the power stage; namely, the gate of the N-MOS is connected to the line conducting the signal CMD_N and the gate of the P-MOS is connected to the line conducting the signal CMD_P via an inverter 36. Thus, the current $I'_{OUT}$ passes through the impedance $R_{Composite}$ via the N-MOS or P-MOS, simultaneously as the current $I_L$ passes through the N-MOS and P-MOS transistors of the power stage. Therefore, averaged over one conduction cycle, the composite load reproduces similar compounds of the impedances $R_{DS(P,N)}$ of the transistors as the power stage, as follows from relation (1.6).

In practice, the transistors of the composite load are scaled smaller replica of the power stage. This means, that the channel width of the N-MOS and P-MOS 320 and 322 have the scaled channel width $k \cdot W_{(N)}$ and $k \cdot W_{(P)}$, where $W_{(N)}$ and $W_{(P)}$ is the channel width of the N-MOS and P-MOS power switches, respectively. Preferably, the channel length L of the transistor 320 and 322 may be identical with the channel length of the power-stage MOS. By this configuration, the impact of the positive supply voltage $V_{DD}$, the temperature of the system and the variation of the process is advantageously eliminated. Moreover, the impact of the duty-cycle is eliminated, as described by Equation (1.6). Consequently, the impedance $R_{Composite}$ allows to eliminate all these parasitic components from the average voltage drop $V_{AVG}$. As a result, the accuracy of the measurement of $\hat{I}_{OUT}$ is very high.

The current sensing circuit 30 depicted on FIG. 3 comprises a differential amplifier 300 having as $V_+$ input the output voltage $V_{AUX}$ provided by the filtered auxiliary power stage output voltage, and as $V_-$ input the output provided by the filtering of the power stage output voltage $V_{LX}$. The differential amplifier produces an output voltage that is an amplification of the average voltage drop $V_{AVG}' = V_+ - V_-$. The differential amplifier 300 may be a differential low-offset amplifier. The low offset of the operational amplifier 300 is essential for the high accuracy of the current sensing.

The current sensing circuit 30 depicted on FIG. 3 also comprises, for each input of the differential amplifier 300, a low pass filter. A first low-pass filter 310 provides to the $V_+$ input an average value of the output voltage $V_{AUX}$, and a second low-pass filter 312 provides to the $V_-$ input of the differential amplifier an average value of the output voltage $V_{LX}$. The filters 310, 312 sensing the voltage drop across the power stage may be realized by passive components, thus advantageously reducing the requirements on the speed of the operational amplifier, as only direct current component is amplified.

Figure 4:
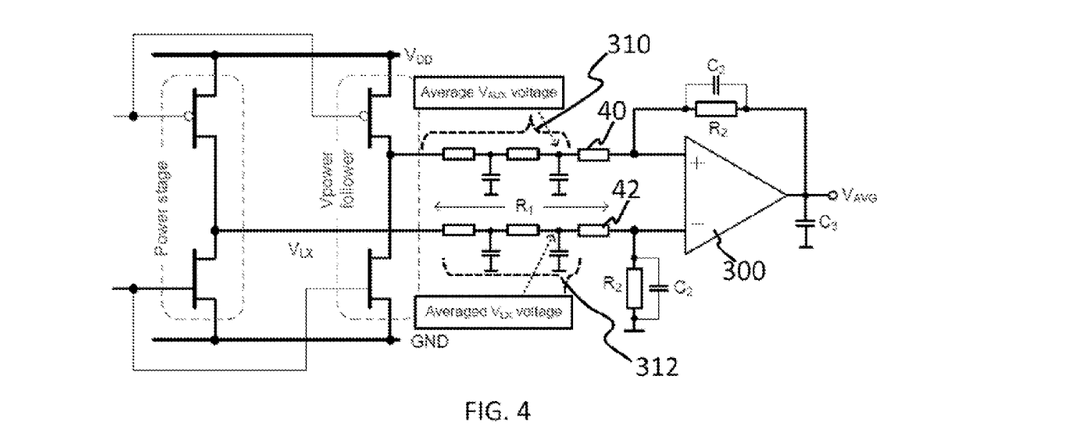
FIG. 4 exemplifies detail of a differential amplifier and low-pass filter in the system for measuring an output current $\hat{I}_{OUT}$ of a DC-to-DC converter.

Referring now to FIG. 4, it shows detailed schematics of the amplifier and filters. Here, the filters 310, 312 are $2^{nd}$ order low-pass RC filters. It is to be understood that $1^{st}$ order RC filters may be used if the remaining oscillation of the voltage at the RC-filter outputs will be sufficiently removed by the high CMRR (Common-Mode-Rejection-Ration) of the operational amplifier. In practice, $2^{nd}$ order RC filters are used to improve speed of the current sensing, and should be designed with high-quality factor Q, e.g. Q~0.45. Both frequency filters should be designed to have perfectly equal electrical performances.

The current sensing circuit 30 depicted on FIG. 4 also comprises RC bridges ($R_2C_2$) between each input $V_+$ and $V_-$ of the differential amplifier and the power stage and the auxiliary power stage and a capacitor ($C_3$) connected to the output of the differential amplifier and the ground. The feedback capacitors $C_2$ and the output capacitor $C_3$ advantageously lower the voltage ripple at the output of the differential amplifier 300. This ripple comes from the switching nature of the impedance $R_{Composite}$, when two different currents are supplied by the amplifier output to $R_{Composite}$, depending on which N-MOS or P-MOS is conducting the impedance $R_{Composite}$.

The current sensing measurer 30 depicted on FIG. 4 also comprises at least one resistor 40 between the input $V_+$ of the differential amplifier and the first low-pass filter 310, and at least one resistor 42 between the input V of the differential amplifier and the second low-pass filter 312. These resistances avoid the impact of a "virtual ground"—meaning zero voltage between the inputs $V_+$ and $V_-$—to the RC filters frequency characteristics.

The DC gain G of the differential amplifier represented in FIG. 4 is given by the equation:

$$G = \frac{R_2}{R_1}$$

wherein the impedance $R_1$ is the sum of the impedances that are connected in series between the output of the power stage and the input $V_-$ of the differential amplifier. In other words, the impedance $R_1$ is the sum of the impedances of the low pass filter 312 and the impedance of the resistance 42 between the input $V_-$ of the differential amplifier and the second low-pass filter 312.

Preferably, the differential amplifier in FIG. 4 may be compensated by the offset. The accuracy of the voltage gain can be achieved by a matching between $R_1$ and $R_2$, including the matching of the upper and lower side of the feedback network.

Figure 5:
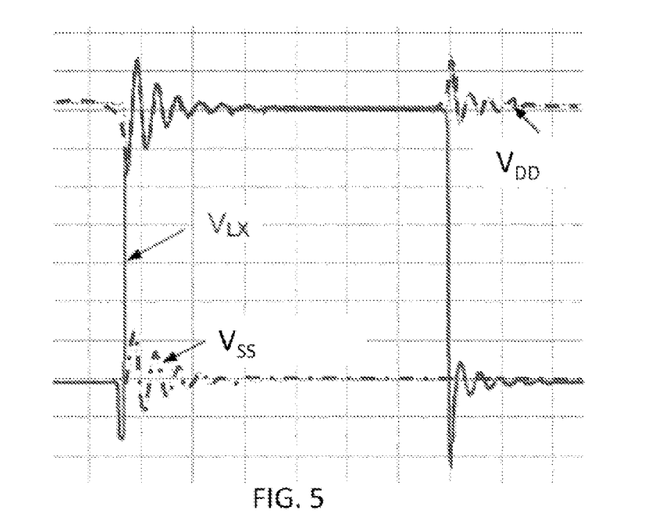
FIG. 5 shows an example of a simulation of the $V_{LX}$, and positive and negative power rails voltage on real-like circuit containing parasitic ringing.
Figure 6:
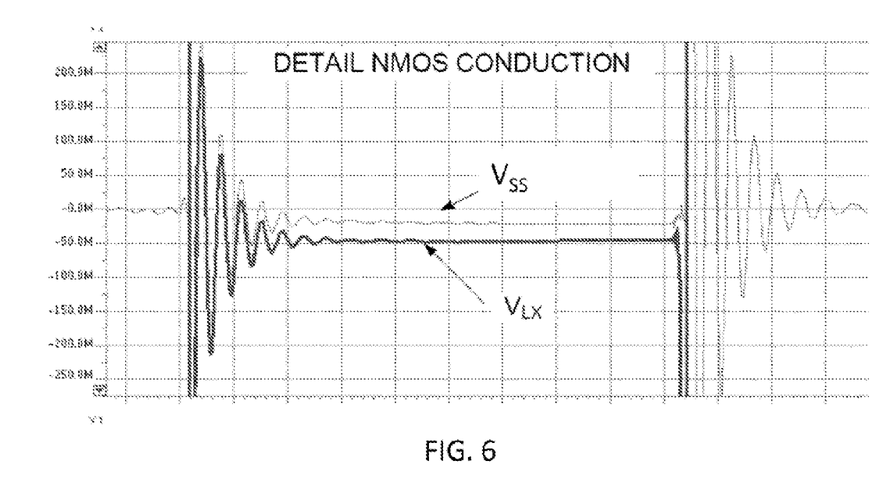
FIG. 6 shows an example of a detail of an N-MOS transistor conduction of the simulation example of FIG. 5.

Referring now to FIG. 5, it shows an example of the waveforms for real-like circuit: the output voltage $V_{LX}$ of the power stage, the positive supply voltage $V_{DD}$ and the negative supply voltage $V_{SS}$ comprise oscillations that are simply removed by the RC low-pass filters. FIG. 6 shows an example of the waveforms during N-MOS conduction: again, oscillations are removed by the RC filter 312.

Back to FIG. 3, the current sensing circuit 30 further comprises an inverter 36 for providing, of N-MOS transistor of the impedance $R_{Composite}$, a positive voltage shift of control signal (CMD_N) that drives the N-MOS transistor of the power stage of the DC-to-DC converter. The voltage doubler creates a $2*V_{DD}$ voltage when the N-MOS transistor 320 is required to be conductive. This advantageously allows the N-MOS to be in the ohmic region even when its source is connected to the $V_{DD}$. The obtained negative voltage level of control signal of N-MOS 320 is the positive voltage $2V_{DD}$. Thus, the $V_{GS}$ voltage of the power N-MOS and sense N-MOS 320 are identical, and the scaled $R_{DS(P)}$ resistances match perfectly.

Figure 12:
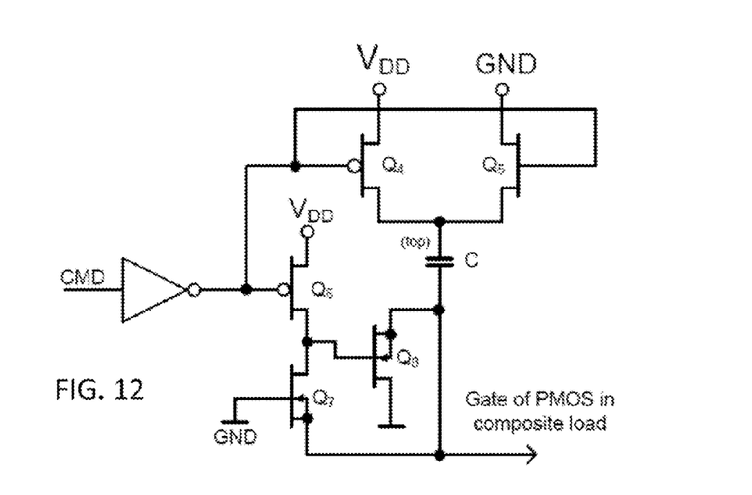
FIG. 12 shows an example of a voltage inverter able to drive a P-MOS transistor in the impedance $R_{Composite}$.
Figure 13:
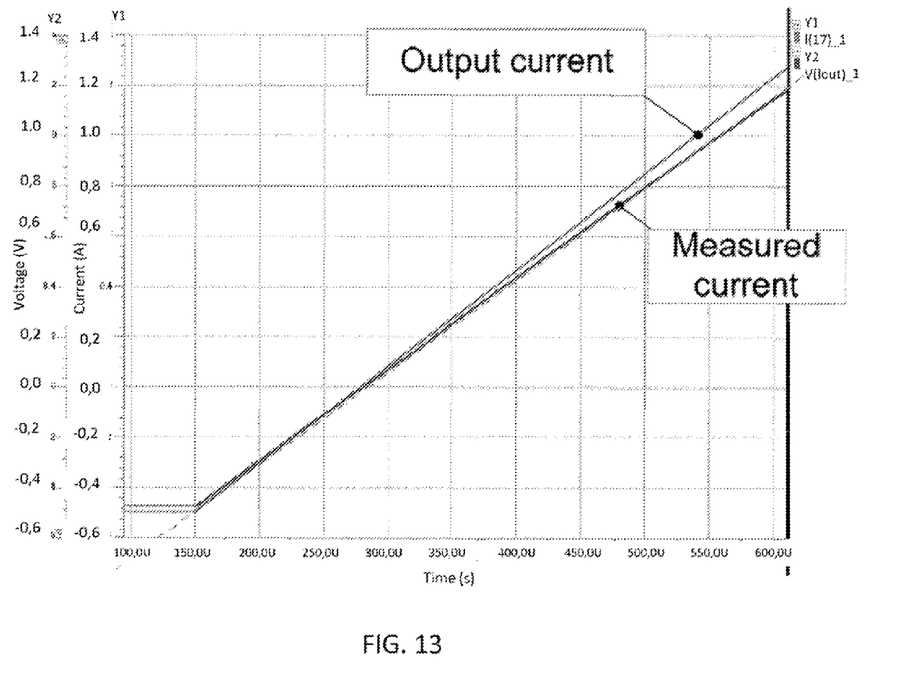
FIG. 13 shows an example of a simulated detection accuracy of current-sensing circuit of FIG. 4.

FIG. 12 shows an example of a circuit for implementing the voltage inverter for driving a sense PMOS. The voltage inverter comprises a P-MOS transistor $Q_4$ with its source connected to the positive supply voltage $V_{DD}$ and its drain connected to the drain of a N-MOS transistor $Q_5$, the N-MOS transistor $Q_5$, having its source connected to ground. The voltage inverter further comprises a P-MOS transistor $Q_6$ with its source connected to the positive supply voltage $V_{DD}$ and its drain connected to (i) the drain of the N-MOS transistor $Q_7$ and to (ii) the gate of the N-MOS transistor $Q_8$. The gate of the N-MOS transistor $Q_7$ and the source of the N-MOS transistor $Q_8$ are connected to ground GND. The voltage inverter also comprises a floating capacitor (C) connected, on a first end, to the drain of the N-MOS transistor $Q_8$ and to the source of N-MOS transistor $Q_7$. The first end of the capacitor is the output of the voltage inverter which is connected to the gate of the P-MOS of the impedance $R_{Composite}$. The second end of the capacitor, noted top in FIG. 13, is connected to the drain of the P-MOS transistor $Q_4$ and drain of the N-MOS transistor $Q_5$. The voltage inverter also comprises an inverter. The input of the inverter is connected to the line providing the control signal (CMD_P). The output of the inverter is connected to the gates of the P-MOS transistors $Q_4$, $Q_6$ and the gate of the N-MOS transistor $Q_5$.

As discussed in relation to FIG. 1, a DC-to-DC converter may typically comprise a shoot through protection circuit 12 that creates driving commands with death time. However, various conduction modes result in an uncontrollable error of the current sensing. This is for instance the case when the current $I_L$, at the end of the N-MOS or P-MOS conduction, is either positive or negative. In fact, during the non-overlapping instants, the conduction is provided by either P-MOS or N-MOS substrate diodes. These undefined body-diode conduction instants add an important amount of unwanted energy which is integrated in the RC filters. The presence of this unwanted energy and its integration by RC filters can cause an unwanted shift of the measured current, which is inappropriate for the DC-to-DC converter.

Figure 8:
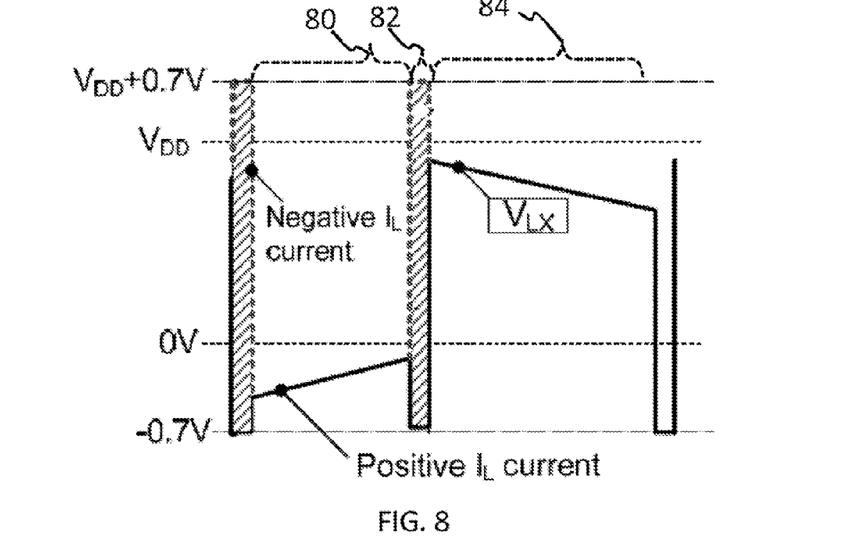
FIG. 8 shows an example of the $V_{LX}$ voltage with positive/negative coil current causing the conduction of N-MOS and P-MOS body diodes, respectively.

This effect is show in FIG. 8 that depicts an example of a time characteristic of power stage output voltage $V_{LX}$ with error caused by the body-diode conduction. While the P-MOS is conducting (80), that is during the P-MOS phase, the current $I_L$ is positive, as seen on FIG. 2. Then when the P-MOS conduction stops, it occurs a time period 82 during which either the P-MOS or the N-MOS body-diodes are conducting. This time period 82 is represented by the dashed area. During that period 82, the output voltage $V_{LX}$ of the power stage, represented by the thick line, can have a positive value near $V_{DD}$+0.7V or a negative value near −0.7V. Next (84), the N-MOS starts conduction and the output voltage $V_{LX}$ reaches the negative supply voltage GND, and the body diode conduction occurs again. This is repeated for each period T resulting in an amount of unwanted energy integrated in the RC-filters.

In order to eliminate the inaccuracy coming from the $V_{LX}$ transitions phases, the current sensing circuit from FIG. 3 further comprises a masking circuit for masking the body-diode conduction intervals. The masking circuit comprises a first disconnection circuit for disconnecting the RC filter 310 input from the auxiliary power stage and a second disconnection circuit for disconnecting the RC filter 312 input from the power stage during body-diode conduction intervals. In practice, the first and second disconnection circuits may disconnect the low-pass filters 310, 312 inputs and connect these inputs to GND (via transistor $Q_3$ in FIG. 9). During this period, both RC filters integrate identical voltages.

Figure 9:
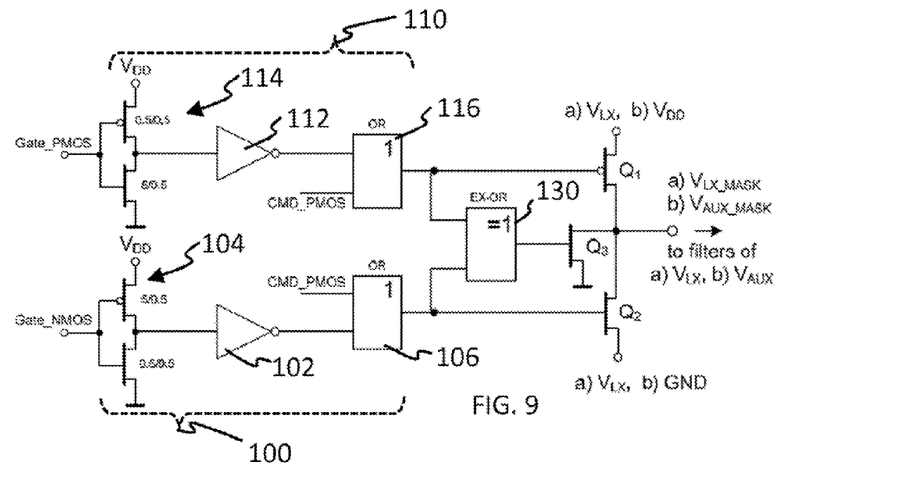
FIG. 9 shows an example of a transition masking circuit.

FIG. 9 shows an example of a disconnection circuit. The identical circuits are used for a) disconnecting $V_{LX}$ from the filter 312, and b) disconnecting the filter 310 from the auxiliary power stage. The letters a) and b) denote the signals connected to appropriate terminals in FIG. 9.

The disconnection circuit comprises switches $Q_1$, $Q_2$, $Q_3$ that are driven by the signals allowing to anticipate the $V_{LX}$ transitions. Because the $V_{LX}$ transitions are anticipated, the inputs of the RC-filters are disconnected sufficiently before and reconnected after the $V_{LX}$ transitions. The anticipation is driven by handling the signals available in the power stage, e.g. power-MOS gate signals, the Gate_P-MOS, Gate_N-MOS and signal CMD_P.

A first and second part of circuits 100, 110 are dedicated to the handling of the available signals. The first part 100 comprises an unbalanced inverter 102. The inverter is unbalanced by the P-MOS and N-MOS 104 serially connected and having their gate connected to the Gate_N-MOS directly, the Gate_N-MOS being the gate voltage of the N-MOS switch of the power stage. As shown on FIG. 9, the P-MOS and N-MOS 104 may have a channel width W and channel length L selected such that W/L=5/0.5 μm and 0.5/0.5 μm, respectively. The output of the inverter is connected to a first input of an OR gate 106, the second input of the OR gate being connected to the CMD_P signal. The output of the OR gate is connected to a switch $Q_1$ and to an input of an XOR gate 130.

The second part 110 comprises an inverter 112 that is unbalanced. The inverter is unbalanced by the P-MOS and N-MOS 114 serially connected and having their gate connected to the Gate_P-MOS signal that is supplied to the gate voltage of the P-MOS of the power stage. The P-MOS and N-MOS 104 may have a channel width W and channel length L selected such that W/L=0.5/0.5 μm and 5/0.5 μm, respectively. The output of the inverter 112 is connected to a first input of an OR gate 116, the second input of the OR gate being connected to the CMD_P signal. The output of the OR gate 116 is connected to a switch $Q_2$ and to an input of the XOR gate 130. The output of the XOR gate 130 is connected to the transistor $Q_3$ that has its source connected to the sources of the transistors $Q_1$ and $Q_2$.

In the case of the first disconnection circuit referred to a) in FIG. 9, the drain of the transistor $Q_1$ is connected to the positive voltage supply $V_{DD}$, and the drain of the transistor $Q_2$ is connected to the negative voltage supply $V_{SS}$, e.g. GND. In the case of the second disconnection circuit b), the drain of the transistor $Q_1$ is connected to the output of the power stage $V_{LX}$, and the drain of the transistor $Q_2$ is also connected to the output of the power stage $V_{LX}$.

When both the P-MOS and the N-MOS of the power stage are not conducting (they are OFF), the transistors $Q_1$ and $Q_2$ are non-conducting and $Q_3$ is conducting (it is ON) and connected to the ground.

As output of the masking circuit FIG. 9, signal $V_{LX\_MASK}$ is sent in the case a) of the first disconnection circuit to RC-filter 312, and signal $V_{AUX\_MASK}$ is sent in the case of the second disconnection circuit b) to the RC filter 310.

Figure 10:
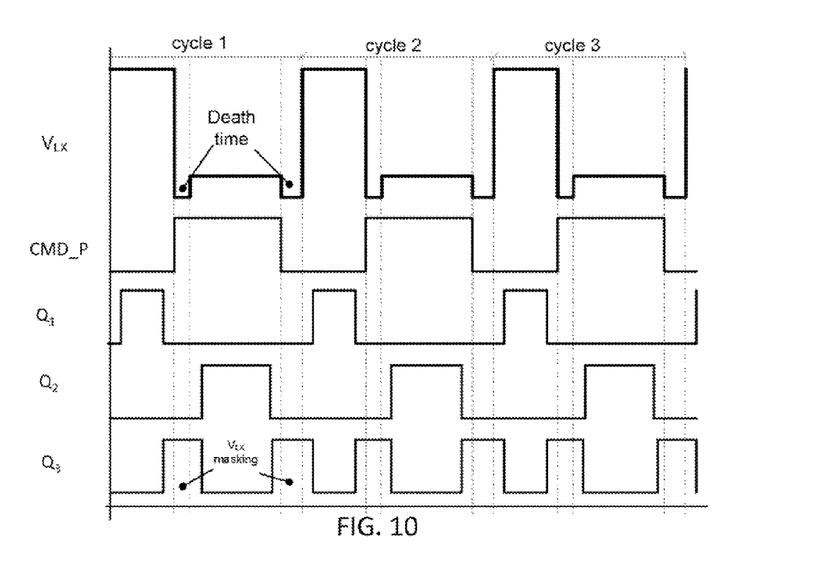
FIG. 10 shows an example of waveforms for the transition-masking circuit.

Referring now to FIG. 10, it illustrates a timing diagram showing the voltage $V_{LX}$, the driving signal CMD_P and CMD_N of the power stage, the states of the switches $Q_1$, $Q_2$, $Q_3$. As discussed in reference to FIG. 8, a DC-to-DC converter may comprise a non-overlapping circuit 12 that creates driving commands with death times during which neither the P-MOS nor the N-MOS are conducting. The death times are shown on FIG. 10. Because the first and second parts of circuit 100, 110 anticipate the rising edges and the falling edges of the signal CMD_P, the disconnection circuit can drive the switches $Q_1$ and $Q_2$ so that their respective state (ON or OFF) anticipate the rising edges and the falling edges of the signal CMD_P. In practice, the anticipation of the rising and falling edges is about few nanoseconds. For instance, the transistor $Q_1$ is switched to OFF slightly before the signal CMD_P goes to $V_{DD}$ and is switched ON after the signal CMD_P goes to GND. By this way, the transistor $Q_1$ almost simultaneously switched ON/OFF with the power stage P-MOS, and $Q_2$ almost simultaneously with the power-stage N-MOS. During the death-time, both $Q_1$ and $Q_2$ should be off. The switch $Q_3$ is ON when both switches $Q_1$ and $Q_2$ are OFF, and it is OFF when one of switches $Q_1$ and $Q_2$ are ON.

Figure 7:
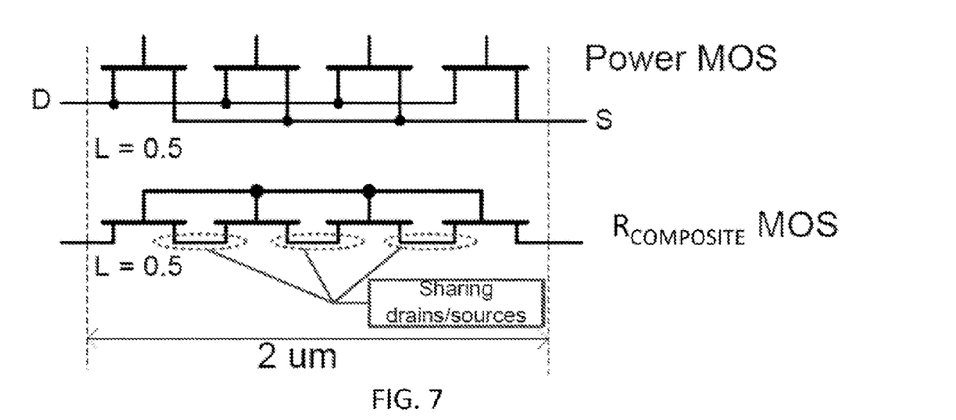
FIG. 7 shows a comparison of the MOS transistors of the power stage of the DC-to-DC converter and the MOS transistors used in the impedance $R_{Composite}$.

FIG. 7 discusses the scaling ratio k between the transistors of the impedance $R_{Composite}$ and the power-stage transistors. As seen previously, k is preferably very low such that k<<1. This allows to obtain a low current replication rate, thus limiting the consumption of energy of the measuring system of the invention. Having a small scaling ratio k involves also having a very-small size of the composite transistors 320 and 322. However, a low effective surface of this transistor yields decreased matching between the transistors of the impedance $R_{Composite}$ and the power-stage transistors: indeed, the matching can be approximated by the following relation:

$$hing \approx \frac{1}{\sqrt{W.L}}.$$

Thus, the smaller the impedance $R_{Composite}$ is, the less accurate the matching is. In order to increase the effective surface W. L of the impedance $R_{Composite}$, the configuration example for the N-MOS of the transistors of the impedance $R_{Composite}$ depicted on FIG. 7 is used. It is to be understood that a similar configuration is used for the P-MOS. In this configuration, the N-MOS of the $R_{Composite}$ comprises four N-MOS transistors connected in series, wherein two successive N-MOS transistors share a drain and a source. In fact, the layout of transistors of the impedance $R_{Composite}$ and the layout of the power MOS of the power stage can almost be identical, which helps to improve the matching. The power N-MOS in the example shown in FIG. 7 is a four-finger device, that is, four MOS transistors are connected in parallel. A serial connection of four transistors increases by four the effective surface of the reference transistor for identical replica ratio k, and identical length L for the transistors of the impedance $R_{Composite}$ and the transistors of the power-stage (compared to single transistor sense-MOS). Moreover, the drainsources of these serially connected transistors are shared, which allows to obtain identical STI-stress (shallow trench isolation). Advantageously, this increases the accuracy of matching.

Figure 11:
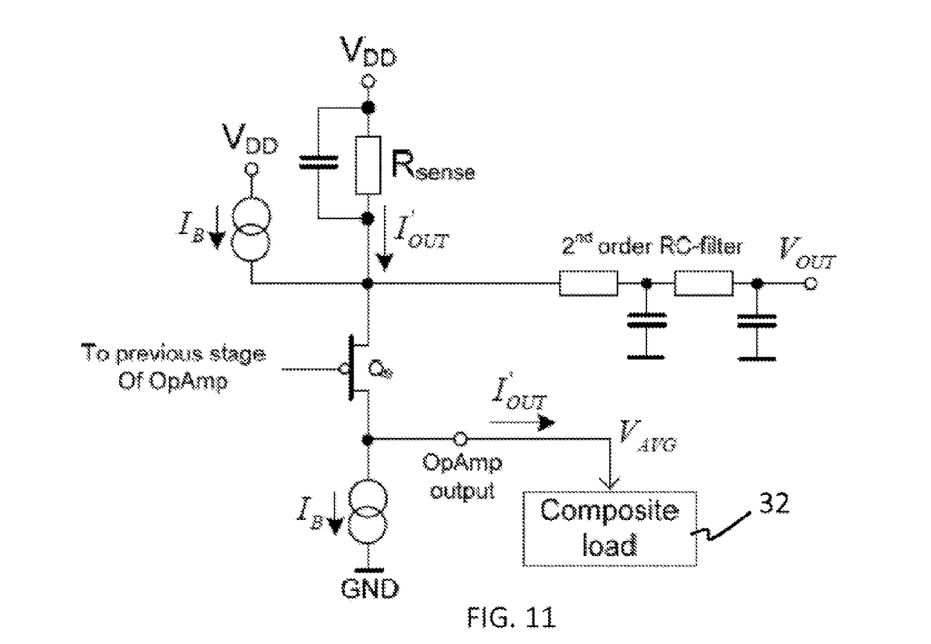
FIG. 11—shows the principle of a current sensor for sensing the output current I'$_{OUT}$ at the positive supply rail of the differential amplifier.

FIG. 11 shows an output stage of a differential amplifier, as the one depicted and discussed in relation to FIG. 3, that comprises a current sensor for sensing the output current I'$_{OUT}$ at the positive supply rail of the differential amplifier. This advantageously allows measuring the output current I'$_{OUT}$ without error of the current mirrors. Errors can reach up to 15%, depending on the process. In other terms, any error of the current-recopying is avoided.

The current obtained at the positive supply rail of the differential amplifier output stage is exactly the current passing through the impedance $R_{Composite}$, therefore improving the accuracy of the measurement.

Referring to FIG. 11, the principle of the current sensor for sensing the output current I'$_{OUT}$ at the positive supply rail of the differential amplifier is shown. A current I$_b$ is a constant current source of few micro amperes (µAs) and is not affecting the output current I'$_{OUT}$. Only error current is caused by the current passing through the feedback resistance R$_2$, as shown on FIG. 4. However, this can be minimised by the very large resistances to fraction of µAs; the very large resistances may be at least of one megaohm.

In practice, the current sensor comprises a sensing impedance R$_{sense}$ traversed by the output current I'$_{OUT}$ of the DC-to-DC converter such that the voltage across this impedance R$_{sense}$ is proportional to the output current. This voltage may be measured by e.g. an AD converter. The impedance R$_{sense}$ may be mounted in parallel with a capacitor. The ripple of the output voltage caused by the commutation of the impedance R$_{Composite}$ is filtered by a passive RC-filter. The passive RC filter may be a second order RC-filter, as shown on FIG. 11. By using a fast RC filter, the typical response time of the current-sensor can be a few µs.

If the resistance R$_{Sense}$ is used to sense the output current I'$_{OUT}$, the voltage across this sensing impedance R$_{Sense}$ is directly proportional with the power stage output current. If the resistance is calibrated or accurate enough, the output voltage on the output of RC-filter the sensing impedance R$_{Sense}$ is:

$$V_{OUT} = V_{DD} - I'_{OUT} R_{Sense}.$$

It results from the equation (1.6) that the DC-DC convertor power stage output current I'$_{OUT}$ corresponds to $$\hat{I}_{OUT} = \frac{1}{k \cdot G \cdot R}(V_{DD} - \hat{V}_{OUT})$$

Referring now to FIG. 13, an example of the simulated characteristic with the current-sensing system of the invention is shown. The line with crosses represents the output current of the DC-to-DC converter, and the straight line represents the measured output current of the DC-to-DC converter. It is noticeable that the measured output current has a good linearity and a good accuracy. There is a systematic error of the measured output current $\hat{I}_{OUT}$, observed in order of +/−2 percent, that depends on the temperature and on the positive supply voltage V$_{DD}$. This error can be removed by adjusting the scaling ratio k. Interestingly, a mote-Carlo simulation shows the dispersion of accuracy (including Temperature, V$_{DD}$ variation and geometric mismatch of process) below 5%, which is obtained thanks to the high surface of the composite MOS transistor FIG. 7 and by the offset compensation of the differential amplifier 300.

Hence, the presented system for measuring the output current $\hat{I}_{OUT}$ of a DC-to-DC converter allows accurate sensing of the DC/DC converter output current. Interestingly, the presented system can be used when integrated switches are used, and it may be integrated with the DC-to-DC converter. The DC-to-DC converter and the system for measuring the output current $\hat{I}_{OUT}$ may be integrated on an identical chip. The presented system allows obtaining an absolute value of the output current, with very simple implementation, while avoiding the decrease of the power efficiency because no component exterior to the integrated components is introduced. This makes the system suitable for low-cost low-surface integration.

The invention has been described with reference to preferred embodiments. However, many variations are possible within the scope of the invention. For instance, the invention can be implemented for any type of DC-to-DC step down converter or a circuit can be advantageously realized to have the R$_{sense}$ impedance referred to GND.

The invention claimed is:

1. A system for measuring an output current $\hat{I}_{OUT}$ of a DC-to-DC converter, the DC-to-DC converter comprising a transistor power stage, the system comprising:
   a voltage measuring circuit, connected to an output of the transistor power stage of the DC-to-DC converter, the voltage measuring circuit measuring an average voltage drop V'$_{AVG}$ on impedances R$_{DS\ (P,N)}$ of transistors of the transistor power stage; and
   an impedance R$_{Composite}$, connected to an output of the voltage measuring circuit providing a current I'$_{OUT}$, the impedance R$_{Composite}$ reproducing the impedances R$_{DS\ (P,N)}$ of the transistors of the transistor power stage and being traversed by the current I'$_{OUT}$ such that $\hat{I}_{OUT} = V_{AVG}/(G \cdot k \cdot R_{Composite}) = I'_{OUT}/(G \cdot k)$, wherein k is a scaling ratio and G is a voltage gain that amplifies the voltage V'$_{AVG}$ to V$_{AVG}$, and further wherein the impedance R$_{Composite}$ comprises an N-MOS transistor and a P-MOS transistor that are connected in parallel, the N-MOS transistor and the P-MOS transistor operating in ohmic area, being simultaneously switched with the transistors of the transistor power stage and driven by control signals of the transistors of the transistor power stage.

2. The system of claim 1, wherein the impedance R$_{Composite}$ comprises:
   at least another N-MOS transistor connected in series with the N-MOS transistor, the N-MOS transistors sharing an N-MOS drain and an N-MOS source; and
   at least another P-MOS transistor connected in series with the N-MOS transistor, the P-MOS transistors sharing a P-MOS drain and a P-MOS source.

3. The system of claim 1, further comprising a voltage inverter providing, to a gate of the P-MOS transistor of the impedance R$_{Composite}$, a negative voltage of control signal driven P-MOS transistor of the transistor power stage of the DC-to-DC converter.

4. The system of claim 3, wherein the voltage inverter comprises:
   a first P-MOS transistor Q$_4$ with its source connected to a positive supply voltage V$_{DD}$ and its drain connected to a drain of a first N-MOS transistor Q$_5$, the first N-MOS transistor Q$_5$ having its source connected to a ground;
   a second P-MOS transistor Q$_6$ with its source connected to the positive supply voltage V$_{DD}$ and its drain connected to a drain of a second N-MOS transistor Q$_7$ and to a gate of a third N-MOS transistor Q$_8$, a gate of the second N-MOS transistor Q$_7$ and a source of the third N-MOS transistor Q$_8$ being connected to the ground;
   a capacitor connected, on a first end that is an output of the voltage inverter, to a drain of the third N-MOS transistor Q$_8$ and to a source of second N-MOS transistor Q$_7$, and connected, on a second end, to the drain of the first P-MOS transistor Q$_4$ and to the source of the first N-MOS transistor Q$_5$; and
   an inverter connected, on an input, to a line providing the control signal driven P-MOS transistor of the transistor power stage, and connected, on an output, to the gates of the first and second P-MOS transistors Q$_4$, Q$_6$ and the gate of the first N-MOS transistor Q$_5$.

5. The system of claim 1, wherein the voltage measuring circuit comprises:

an auxiliary power stage that is identical to the transistor power stage of the DC-to-DC converter, similarly powered and driven, the auxiliary power stage being not traversed by the output current of the DC-to-DC converter; and a differential amplifier having an output voltage $V_{AUX}$ as a $V_+$ input provided by the auxiliary power stage and having an output voltage $V_{LX}$ as a $V_-$ input provided by the transistor power stage, the differential amplifier producing an output voltage $V_{AVG}$ that is the amplified average voltage drop $V'_{AVG}$.

6. The system of claim 5, wherein the voltage measuring circuit further comprises:
   a first low-pass filter providing to the $V_+$ input of the differential amplifier an average value of the output voltage $V_{AUX}$; and
   a second low-pass filter providing to the $V_-$ input of the differential amplifier an average value of the output voltage $V_{LX}$.

7. The system of claim 6, wherein the first low-pass filter and the second low-pass filter are:
   an RC filter of the first order; and/or
   an RC filter of the second order.

8. The system of claim 6, wherein the voltage measuring circuit further comprises:
   at least one first resistor between the input $V_+$ of the differential amplifier and the first low-pass filter; and
   at least one second resistor between the input $V_-$ of the differential amplifier and the second low-pass filter.

9. The system of claim 5, wherein the voltage measuring circuit further comprises:
   an RC filter $R_2C_2$ connected to the input $V_+$ of the differential amplifier and an output of the differential amplifier;
   an RC filter $R_2C_2$ to the input $V_-$ of the differential amplifier and the ground; and
   a capacitor $C_3$ connected to the output of the differential amplifier and the ground.

10. The system of claim 5, wherein the voltage measuring circuit further comprises:
    a first disconnection circuit for disconnecting the $V_+$ input from the auxiliary power stage; and
    a second disconnection circuit for disconnecting the $V_-$ input from the transistor power stage during body-diode conduction intervals of the transistors of the transistor power stage and of transistors of the auxiliary power stage.

11. The system of claim 5, wherein the differential amplifier comprises a current sensor for sensing the output current $I'_{OUT}$ at a positive supply rail of the differential amplifier, the current sensor comprising an impedance $R_{sense}$ traversed by the output current $I'_{OUT}$ of the DC-to-DC converter such that an output voltage $V_{OUT}$ is proportional to the output current $I'_{OUT}$.

12. A process for measuring an output current $\hat{I}_{OUT}$ of a DC-to-DC converter, the DC-to-DC converter comprising a transistor power stage, the process comprising:

obtaining an average voltage drop $V'_{AVG}$ on impedances $R_{DS\ (P,N)}$ of transistors of the transistor power stage;

applying an amplified average voltage drop $V_{AVG}=G \cdot V'_{AVG}$ on an impedance $R_{Composite}$ that reproduces the impedances $R_{DS\ (P,N)}$ of the transistors of the transistor power stage;

measuring a current $I'_{OUT}$ that traverses the impedance $R_{composite}$; and obtaining an output current $\hat{I}_{OUT}$ from the measured current $I'_{OUT}$, the output current $\hat{I}_{OUT}$ being defined by $\hat{I}_{OUT}=V_{AVG}/(G \cdot k \cdot R_{Composite})=I'_{OUT}/(G \cdot k)$ wherein k is a scaling ratio and G is a voltage gain that amplifies the voltage $V'_{AVG}$ to $V_{AVG}$, and further wherein the impedance $R_{Composite}$ comprises an N-MOS transistor and a P-MOS transistor that are connected in parallel, the N-MOS transistor and the P-MOS transistor operating in ohmic area, being simultaneously switched with the transistors of the transistor power stage and driven by control signals of the transistors of the transistor power stage.

13. A DC-to-DC converter with a transistor power stage, the DC-to-DC converter comprising an apparatus for measuring an output current $\hat{I}_{OUT}$ of a DC-to-DC converter; the apparatus comprising:

a voltage measuring circuit, connected to an output of the transistor power stage of the DC-to-DC converter, the voltage measuring circuit measuring an average voltage drop $V'_{AVG}$ on impedances $R_{DS\ (P,N)}$ of transistors of the transistor power stage; and an impedance $R_{Composite}$, connected to an output of the voltage measuring circuit providing a current $I'_{OUT}$, the impedance $R_{Composite}$ reproducing the impedances $R_{DS\ (P,N)}$ of the transistors of the transistor power stage and being traversed by the current $I'_{OUT}$ such that $\hat{I}_{OUT}=V_{AVG}/(G \cdot k \cdot R_{Composite})=I'_{OUT}/(G \cdot k)$, wherein k is a scaling ratio and G is a voltage gain that amplifies the voltage $V'_{AVG}$ to $V_{AVG}$, and further wherein the impedance $R_{Composite}$ comprises an N-MOS transistor and a P-MOS transistor that are connected in parallel, the N-MOS transistor and the P-MOS transistor operating in ohmic area, being simultaneously switched with the transistors of the transistor power stage and driven by control signals of the transistors of the transistor power stage.

14. The DC-to-DC converter of claim 13, wherein the DC-to-DC converter including the apparatus is integrated on a single integrated component.

* * * * *